United States Patent
Shih et al.

(10) Patent No.: US 6,350,680 B1
(45) Date of Patent: Feb. 26, 2002

(54) PAD ALIGNMENT FOR ALCU PAD FOR COPPER PROCESS

(75) Inventors: Tsu Shih; Hung-Chang Hsieh; Chen-Cheng Kuo, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/578,409

(22) Filed: May 26, 2000

(51) Int. Cl.$^7$ .......................................... H01L 21/4763
(52) U.S. Cl. ....................................... 438/637; 438/401
(58) Field of Search ................................ 438/401, 462, 438/637; 437/924

(56) References Cited

U.S. PATENT DOCUMENTS

| 5,872,042 A | 2/1999 | Hsu et al. | 438/401 |
| 5,897,371 A | 4/1999 | Yeh et al. | 438/633 |
| 5,904,563 A | * 5/1999 | Yu | 438/672 |
| 5,933,744 A | 8/1999 | Chen et al. | 438/401 |

FOREIGN PATENT DOCUMENTS

| EP | 0 718 864 A1 | 6/1996 |
| JP | 3270233 | * 12/1991 |
| JP | 09-326231 | 12/1997 |
| WO | WO 98/27568 | 6/1998 |

* cited by examiner

*Primary Examiner*—David Nelms
*Assistant Examiner*—David Vu
(74) *Attorney, Agent, or Firm*—George O. Saile; Stephen B. Ackerman

(57) ABSTRACT

A new method is provided for the alignment of the patterning of AlCu pads in an environment of copper interconnect line patterns. A layer of passivation material is deposited over a surface that contains alignment marks. The layer of passivation is patterned creating in the surface of the layer of passivation the opening that is required for the AlCu pad in addition to openings for a new pattern of alignment marks. A layer of AlCu is sputter deposited over the surface of the layer of passivation thereby including the openings that have been created in the layer of passivation. This creates a new pattern of alignment marks in the surface of the deposited layer of AlCu whereby these new alignment marks align with the pattern of new alignment marks that has been etched in the layer of passivation. The new alignment marks are then used to pattern the layer of AlCu for the creation of the AlCu pad.

6 Claims, 2 Drawing Sheets

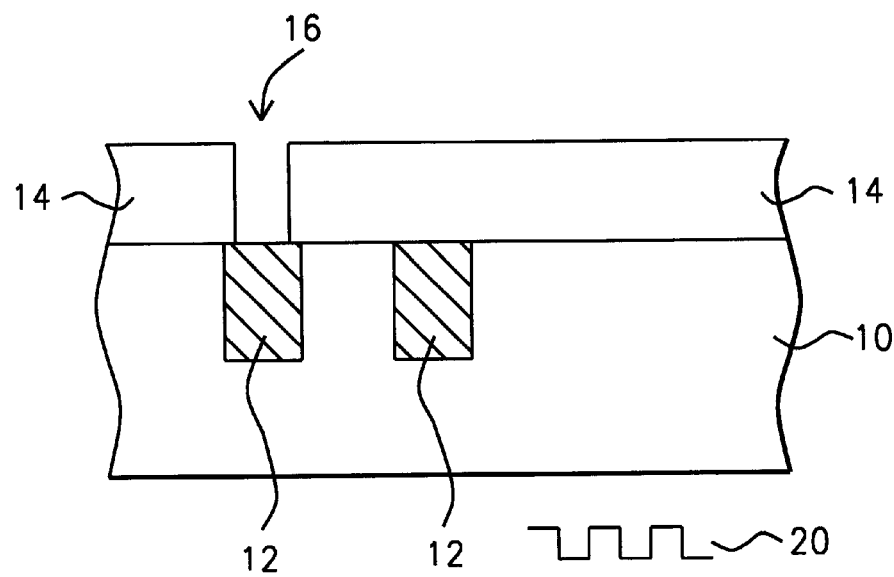
*FIG. 1a – Prior Art*
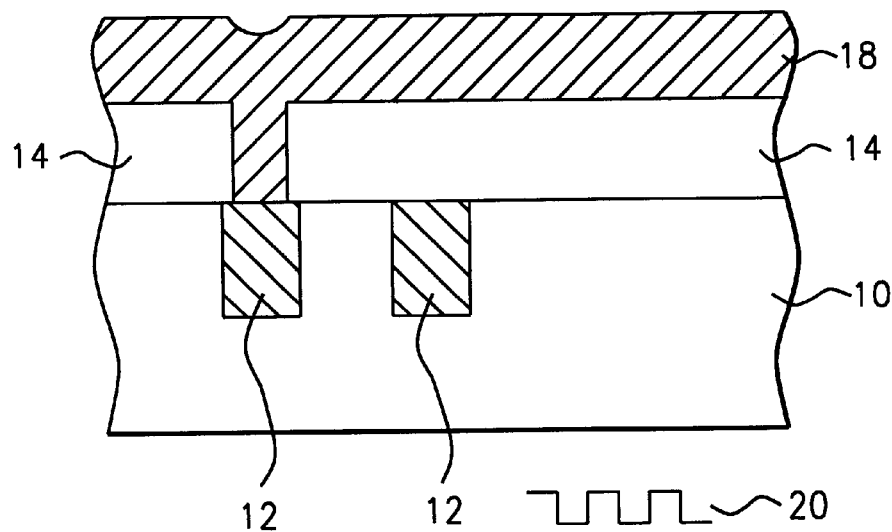
*FIG. 1b – Prior Art*

PAD ALIGNMENT FOR ALCU PAD FOR COPPER PROCESS

BACKGROUND OF THE INVENTION (1) Field of the Invention

The invention relates to the fabrication of integrated circuit devices, and more particularly, to a method for the alignment of AlCu pads as part of the copper metalization process.

(2) Description of the Prior Art

In the design and manufacturing of semiconductor devices, techniques of Very Large Scale Integration (VLSI) and Ultra Large Scale Integration (ULSI) are used to create complex semiconductor devices on the surface of a silicon substrate. Improved device performance is typically made possible by reducing device dimensions, present day technology is reaching device dimensions in the deep submicron range down to 0.1 $\mu$m. To create device features that are part of semiconductor devices, the technique of photolithography is frequently applied. Using this technology device features or device patterns are transferred from a (relatively large dimensional) reticle or photomask to a target surface that is typically the surface of a semiconductor substrate. Step-and-repeat processes allow for the step-wise or gradual transfer of a relatively large dimensional image to ever smaller reproductions of this image to the point where the desired, if needed sub-micron, dimensions of the semiconductor device are reached.

In the process of device feature or pattern exposure, the alignment between successive layers that are being created is of critical importance. Smaller device dimensions place even more stringent requirements on the accuracy of the alignment of the successive layers that are superimposed on each other. Alignment marks that are provided in the lower layers of exposure or typically in the surface of the substrate are in this used to assure alignment between the various layers or patterns that are created. It is clear that device manufacturing yield is directly dependent on how accurate the patterns of the successive layers that make up the device are aligned. Any misalignment can result in for instance interconnect line opens or shorts or shorts or high leakage currents between adjacent regions within a device. Several alignment marks can be provided per wafer, each alignment mark having a specific function such as wafer positioning, contact etching or photoresist patterning. Alignment marks are mostly incorporated into the chip and are placed close to the edge of the wafer. The process of using alignment marks makes use of the step height of the alignment marks. By etching a depth into the surface of a substrate, a step height of the alignment mark is created. Wafer positioning is performed, typically by a wafer stepper tool, to assure proper alignment of a pattern that is to be created in a deposited layer with the pattern of the preceding layer. When performing this wafer alignment, the surface of the (underlying) layer that has been provided with alignment marks is coated with a transparent layer of photoresist. A laser light beam is aimed at the alignment mark, light will be reflected by the alignment mark and provides in this manner an exact indication of the position of the wafer in the stepper tool. This allows the stepper tool to adjust the wafer position to the desired position, making accurate alignment between overlying layers possible. Each photomask that is used for the exposure of the various layers that make up the semiconductor device is provided with alignment marks, which allow for accurate alignment of all photomasks that are used for the creation of the device. During this process, the alignment mark is replicated in the overlying layer and in this manner migrates upward with the successive layers that are being formed. This leads to problems where layers of for instance interconnect metal need to be planarized, thereby potentially erasing the alignment mark. Before the layer of interconnect metal is deposited, the dielectric (Intra-Level Dielectric or ILD) is planarized for reasons of satisfactory metal deposition. This planarization removes the underlying alignment mark, making alignment for the interconnect metal difficult to achieve. In another typical processing sequence, metal interconnects or vias are created in a layer of dielectric or insulation. The metal that is used to fill the interconnects or vias is then deposited over the surface of the dielectric or insulation thereby filling the openings that have been created for the vias. The excess metal is removed from the surface of the dielectric, typically using CMP technology, a process that results in a smooth surface of the layer of dielectric and which eliminates the (required) sharply defined edges of the alignment marks and makes the alignment of overlying layers very difficult. Additional processing steps may in these cases be required in order to restore the visibility of the alignment marks, these additional processing steps add to the cost of the overall device and are therefore to be avoided whenever possible. One of the techniques that is used for this purpose is the creation of the "open frame" whereby the step height of the original mark is recreated.

FIGS. 1a and 1b show a Prior Art process of using alignment marks for the creation of an AlCu pad in an overlying layer. The contact points 12 are points of electrical interconnect that have been created in an underlying layer 10. It is the objective of the process that is highlighted in FIGS. 1a and 1b to create an AlCu pad that overlays and makes contact with at least one of the electrical contact points 12. Alignment marks 20 are present in an underlying layer and are used for both the alignment of the contact points 12 and for the alignment of the to be created and overlying AlCu pad.

The processing flow that is shown in FIGS. 1a and 1b can be summarized as follows in the sequence listed, assuming that the pattern 12 of electrical points of contact has been created in layer 10:

deposit a layer 14 of passivation pattern the layer 14 of passivation for opening 16 sputter deposit a layer 18 of AlCu perform photo exposure and etch for the alignment marks 20 thereby making the alignment marks 20 visible, and perform photo exposure and etch for the AlCu pad.

It must be emphasized that, in the above indicated processing sequence, the photo and etch sequence for the alignment marks are first performed as one processing sequence followed by another processing sequence of photo and resist for the AlCu pad. The first of these two steps, that is the photo and etch steps for the alignment marks 20, is necessary because the alignment marks 20 are not visible through the layer 14 of passivation and layer 18 of AlCu and can therefore not be used as alignment marks for the photo and etch of the AlCu pad that is to be created.

The AlCu pad is to be created over at least one of the points of electrical contact of copper 12 that have been created in the surface of, for instance, a substrate 10. A layer 14 of passivation has been deposited over a surface of layer 10, layer 10 can be the surface of a semiconductor substrate or it can be a layer of dielectric. The layer 14 of passivation has been patterned thereby creating opening 16 (for the AlCu pad) in this layer 14 of passivation whereby opening 16 aligns with at least one of the electrical contact points of copper pattern 12. A layer 18 (FIG. 1b) of AlCu is sputter deposited over the layer 14 of passivation thereby including the opening 16 that has been created in the layer 14 of passivation. Alignment marks 20 have been shown as being present but as being located at a level below the surface of layer 10. The creation of opening 16 required an alignment of the photolithographic mask whereby the mask is aligned using the alignment marks 20, the creation of the AlCu that overlays at least one of the electrical points of contact 12 requires an alignment of a photolithographic mask using the same alignment marks 20. This alignment assumes that the light that is used to perform the process of alignment can penetrate the layer 14 of passivation in addition to the sputter deposited layer 18 of AlCu. The layers 14 of passivation and 18 of AlCu are however opaque and light can therefore not readily penetrate through these layers, making the photolithographic alignment for the AlCu pad difficult and cumbersome. To improve the alignment for the creation of the AlCu pad, the alignment marks 20 must be made visible requiring an extra processing sequence of photolithographic exposure and etch whereby the location that aligns with the alignment marks 20 is opened. These processing steps of photo exposure and etch of the layer 18 of AlCu require Wide Clear Window (WCW) mask layer exposure followed by etch of layers 18 and 14. This latter processing sequence removes layers 18 and 14 from above the alignment marks 20, the alignment marks 20 can then be used to perform the exact photolithographic exposure and etch for the AlCu pad that is in exact alignment with the copper pattern 12. The invention teaches a method of forming an AlCu pad in an environment of copper interconnect lines that can be readily integrated into the regular processing stream. The process of forming the AlCu pad is aimed at creating alignment pads but can possibly be extended to bond pads or any other large surface area on the surface of a semiconductor substrate.

U.S. Pat No. 5,872,042 (Hsu et al.) (TSMC) shows a method for regenerating an alignment mark by etching alignment marks using same photo etch step as the via or contact hole. This patent is very close to the invention. This patent differs from the invention in that the invention etches alignment marks in a passivation layer in contrast with Hsu that etches alignment mark in an IMD layer.

U.S. Pat. No. 5,933,744 (Chen et al.) teaches an alignment mark process used in a chemical-mechanical polish step.

U.S. Pat. No. 5,897,371 (Yeh et al.) teaches an alignment mark process that is compatible with a chemical-mechanical polish process.

SUMMARY OF THE INVENTION

A principle objective of the invention is to provide a method for AlCu pad alignment that is readily integratable in semiconductor manufacturing processes.

Another objective of the invention is to reduce the number of processing steps that is required to accurately align the patterning of AlCu pads.

In accordance with the objectives of the invention a new method is provided for the alignment of the patterning of AlCu pads in an environment of copper interconnect line patterns. A layer of passivation material is deposited over the surface that contains alignment marks. The layer of passivation is patterned creating in the surface of the layer of passivation the opening that is required for the AlCu pad in addition to openings for a new pattern of alignment marks. A layer of AlCu is sputter deposited over the surface of the layer of passivation thereby including the openings that have been created in the layer of passivation. This creates a new pattern of alignment marks in the surface of the deposited layer of AlCu whereby these new alignment marks align with the pattern of new alignment marks that has been etched in the layer of passivation. The new alignment marks are then used to pattern the layer of AlCu for the creation of the AlCu pad.

BRIEF DESCRIPTION OF THE DRAWINGS

FIGS. 1a and 1b show a cross section of a semiconductor layer during a Prior Art processing sequence of forming an AlCu pad, as follows:

FIG. 1a shows a cross section of a Prior Art process of a semiconductor layer that contains points of electrical contact, a layer of passivation has been deposited with an opening created in the layer of passivation over which the AlCu pad will be created. Original alignment marks are part of the cross section.

FIG. 1b shows a cross section of the Prior Art process of FIG. 1a after a layer of AlCu has been sputter deposited over the surface of the layer of passivation and prior to the formation of the AlCu pad.

FIG. 2a shows a cross section of a semiconductor layer that contains points of electrical contact, a layer of passivation has been deposited with openings created in the layer of passivation for both the AlCu pad and for new alignment marks. The original alignment marks are part of the cross section.

FIG. 2b shows the cross section of FIG. 2a after a layer of AlCu has been sputter deposited over the surface of the layer of passivation and prior to the formation of the AlCu pad.

DESCRIPTION OF THE PREFERRED EMBODIMENTS

Figure 2A:
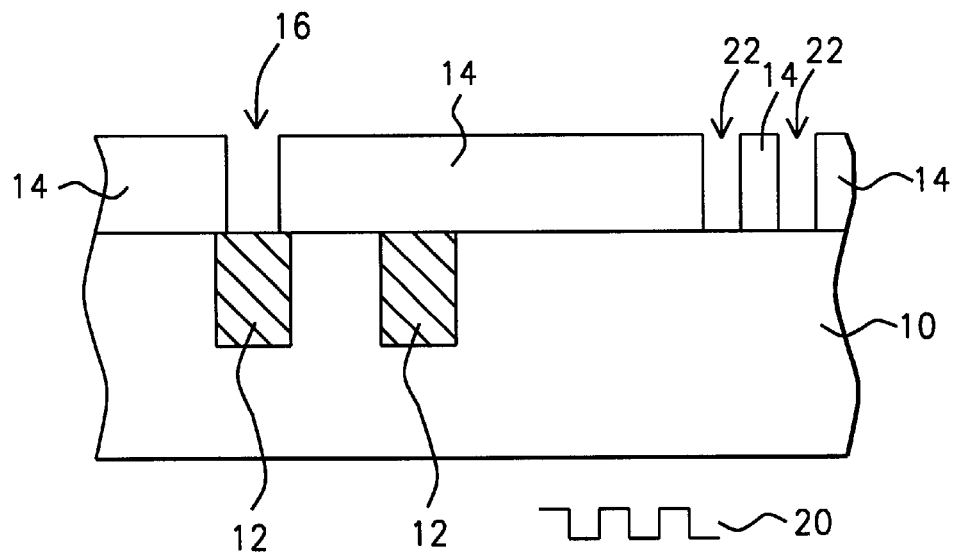
FIGS. 2a and 2b show the process of the invention that has as objective the creation of an AlCu pad, as follows.

Referring now specifically to FIG. 2a, there is shown a cross section of a semiconductor layer 10 that contains points of electrical contact 12, a layer 14 of passivation has been deposited with openings 16 and 22 created in the layer 14 of passivation for both the AlCu pad (opening 16) and for new alignment marks (openings 22). The original alignment marks 20 are part of the cross section.

Clearly shown in FIG. 2a and key to the invention is the creation of openings 22 in the layer 14 of passivation. Openings 22 are located at a known and fixed distance from opening 16, and, since opening 16 has been created by photo align and etch using the original alignment marks 20, the new alignment marks 22 are also located at a known and fixed distance from the original alignment marks 20. The creation of the new alignment marks 22 in the surface of the passivation layer 20 has functionally elevated the original alignment marks 20 to a more accessible surface in the structure making the new alignment marks 22 available for further functions of photolithographic alignment. The process of the invention transposed to original alignment marks to a higher plane and in doing so eliminates the effect of the opaque surfaces that have been created above the original alignment marks 20 by the deposition of the layer 14 of passivation and the subsequently to be deposited layer 18 (FIG. 2b) of AlCu.

Figure 2B:
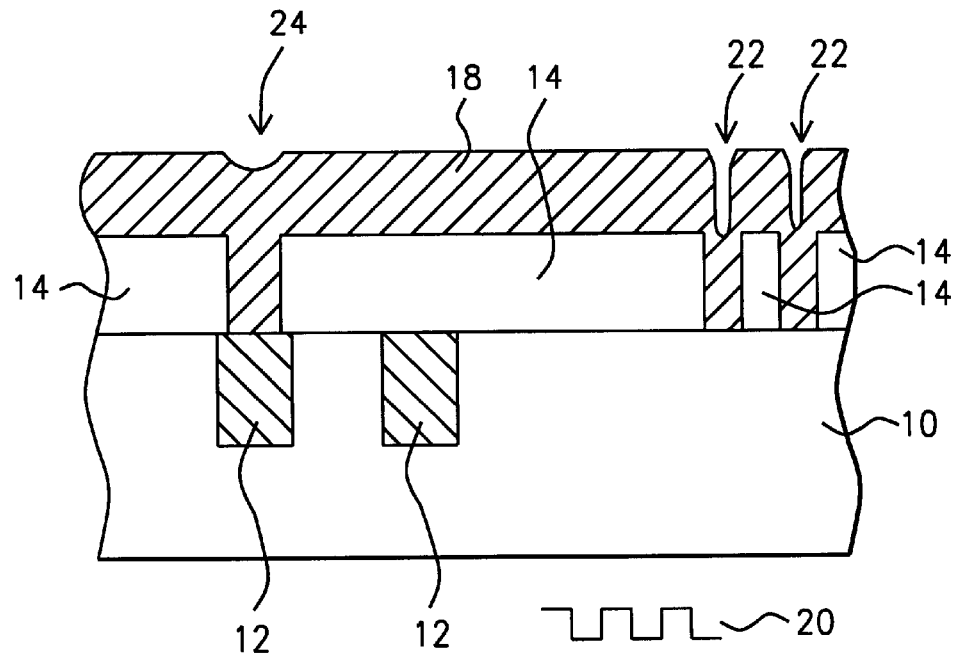

It is clear, FIG. 2b, that the profile of the surface of layer 18 of AlCu that is sputter deposited over the surface of the layer 14 of passivation follows the profile of the layer 14 of passivation. The deposited AlCu will, over the openings 22 that have been created in the layer 14 of passivation, fill these openings and form sharp downgraded profiles over these openings 22. These sharply downgraded profiles are in line with the openings 22 and can therefore be used as points of reference with respect to opening 16. To put this more directly: the profiles that have been created in the (visible) surface of the layer 18 of AlCu can be used to align the photolithographic mask that is used to expose and etch layer 18 for the creation of the AlCu pad.

From the cross section that is shown in FIG. 2b it is clear that it is advantageous in locating the openings 22 to create well identifiable profiles in the (visible) surface of the layer 18 of AlCu. For this reason, it is preferred to deposit a layer 18 of aluminum-copper over the surface of the layer 14 of passivation that has a thickness that is less than a depth of the grooves or trenches 22 that have been created in the layer 14 of passivation. Grooves or trenches 22 are typically between about 0.8 to 1.2 microns in depth and between about 7 to 9 micron in width.

The processing sequence of the invention can be summarized as follows, assuming that the pattern 12 of electrical points of contact has been created in layer 10:
deposit a layer of passivation
pattern the layer of passivation for opening 16 (for the AlCu pad) and for openings 22 (for new alignment marks)
sputter deposit a layer of AlCu, and
perform photo exposure and etch for the AlCu pad.

It is clear that the previously indicated processing steps of the Prior Art, that is perform photo exposure and etch for the alignment marks 20 thereby making the alignment marks 20 visible, have been eliminated by the process of the invention. This elimination reduces processing costs whereby, in addition, the creation of new alignment marks makes available, to the processing sequence that creates an AlCu pad, clear and distinct alignment marks thereby reducing wafer rejects and wafer scrap.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of alignment for the formation of aluminum-copper pads, an alignment mark pattern is previously formed on a surface of a semiconductor substrate, said method comprising:

providing a semiconductor substrate said substrate having points of electrical contact of copper;

depositing a layer of passivation over the surface of said substrate;

etching contact or via holes and a series of grooves or trenches in said layer of passivation, wherein said grooves or trenches are located adjacent to said alignment mark pattern;

depositing a layer of aluminum-copper over the surface of said layer of passivation, whereby said layer of aluminum-copper is of a thickness that is less than a depth of said grooves or trenches in said layer of passivation; and planarizing said layer of aluminum-copper by chemical mechanical polishing.

2. The method of claim 1 wherein said grooves or trenches are oriented orthogonally in the X- and Y-direction.

3. The method of clam 1 wherein said grooves and trenches are formed simultaneously with said via or contact holes.

4. The method of claim 1 wherein said grooves or trenches are between about 0.8 to 1.2 microns in depth and between about 7 to 9 micron in width.

5. The method of claim 1 with the additional step of patterning said layer of aluminum-copper whereby said pattern aligns with said contact or via holes thereby forming aluminum-copper pads that overlay said contact or via holes.

6. The method of claim 1 wherein the distances in the X- and Y-directions measured in a plane that is parallel with a surface of said semiconductor substrate between said alignment mark pattern that has previously been formed on a surface of said semiconductor substrate and said grooves or trenches that are etched in said layer of passivation is known and determined thereby providing a method of correlating pattern alignments between patterns that are created using said alignment mark pattern and patterns using said grooves or trenches.

* * * * *